US008874163B2

United States Patent
Ha et al.

(10) Patent No.: US 8,874,163 B2
(45) Date of Patent: Oct. 28, 2014

(54) METHOD AND APPARATUS FOR MANAGING SOUND VOLUME OF WIRELESS CONNECTION DEVICE IN MOBILE COMMUNICATION TERMINAL

(75) Inventors: Ki-Woong Ha, Suwon-si (KR); Khi-Soo Jeong, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 417 days.

(21) Appl. No.: 12/832,191

(22) Filed: Jul. 8, 2010

(65) Prior Publication Data
US 2011/0009058 A1    Jan. 13, 2011

(30) Foreign Application Priority Data
Jul. 9, 2009 (KR) ........................ 10-2009-0062374

(51) Int. Cl.
H04M 1/00     (2006.01)
H03G 3/00     (2006.01)
H03G 3/02     (2006.01)
H04R 5/04     (2006.01)

(52) U.S. Cl.
CPC .................. *H03G 3/02* (2013.01); *H03G 3/002* (2013.01); *H04R 5/04* (2013.01)
USPC ........................................ 455/552.1; 381/107

(58) Field of Classification Search
USPC ............................................. 455/422.1, 41.2
See application file for complete search history.

(56) References Cited

U.S. PATENT DOCUMENTS

| 7,881,723 | B2* | 2/2011 | Lee .............................. 455/452.1 |
| 2003/0125073 | A1* | 7/2003 | Tsai et al. ...................... 455/552 |
| 2004/0205775 | A1* | 10/2004 | Heikes et al. .................. 719/318 |
| 2007/0263879 | A1* | 11/2007 | Trip et al. ......................... 381/74 |
| 2008/0092149 | A1* | 4/2008 | Rowbotham et al. .......... 719/321 |
| 2010/0233998 | A1* | 9/2010 | Saito ........................... 455/412.2 |

OTHER PUBLICATIONS

Pulido et al., Bluetooth DOC CAR_x_SPEC/0.96B1 Hands-Free Profile, Oct. 22, 2001, pp. 1-70.*
Bluetooth DOC HFP1.5_SPEC Hands-Free Profile 1.5, Nov. 25, 2005, pp. 1-93.*

* cited by examiner

*Primary Examiner* — Nay A Maung
*Assistant Examiner* — Alejandro Rivero
(74) *Attorney, Agent, or Firm* — Jefferson IP Law LLP

(57) ABSTRACT

An apparatus and method for managing a sound volume of a wireless connection device in a mobile communication terminal are provided. The method includes pre-storing a sound volume level of the wireless connection device with respect to each system supported by the mobile communication terminal, and when a call is generated, requesting to determine a sound volume by transmitting to the wireless connection device a sound volume level of a system in which the call is generated among the sound volume levels pre-stored for the respective systems.

6 Claims, 9 Drawing Sheets

METHOD AND APPARATUS FOR MANAGING SOUND VOLUME OF WIRELESS CONNECTION DEVICE IN MOBILE COMMUNICATION TERMINAL

PRIORITY

This application claims the benefit under 35 U.S.C. §119(a) of a Korean patent application filed in the Korean Intellectual Property Office on Jul. 9, 2009 and assigned Serial No. 10-2009-0062374, the entire disclosure of which is hereby incorporated by reference.

BACKGROUND OF THE INVENTION

1. Field of the Invention

The present invention relates to a method and apparatus for managing a sound volume of a wireless connection device in a mobile communication terminal. More particularly, the present invention relates to a method and apparatus for controlling an output sound volume of a device wirelessly connected to a system to which a call is connected in a mobile communication terminal supporting a dual Subscriber Identity Module (SIM) card.

2. Description of the Related Art

With advanced communication technologies, network systems employing various communication mechanisms have been recently provided. According to a region where the network systems are used, at least one of various types of network systems is supported. The network systems have different accounting policies according to a service provider. For example, in Russia, the cost of using the network systems is significantly different according to a network type of each region. For this reason, one mobile communication terminal employs two Subscriber Identity Module (SIM) cards to support two types of networks according to the related art, so that a desired network service can be selectively provided in accordance with user convenience. In this case, to support the two SIM cards, the mobile communication terminal uses two baseband chips as if two terminals are assembled in one case.

In general, a mobile communication terminal supporting only one network system employs only one baseband chip, and thus has one call sound source. Therefore, the mobile communication terminal supporting only one network system has no problem in determining a sound volume when connecting to an external device by using a wireless communication technique, for example, when connecting to a headset or a hand-free device by using a Bluetooth communication technique.

However, since the mobile communication terminal supporting the two SIM cards has two baseband chips to support a simultaneous call function for the two SIM cards, the mobile communication terminal has two call sound sources. In this case, the call sound source has a different sound quality, sound volume, and the like, according to the capability of a corresponding baseband chip. Therefore, when the mobile communication terminal supporting the two SIM cards performs a call by connecting to an external device based on the wireless communication technique, sound sources with different sound volumes are output from the two baseband chips, which leads to a problem in which a user has to manually determine a desired sound volume whenever a call connection system changes. For example, in a case of the mobile communication terminal supporting the two SIM cards, even if the user determines a call sound volume to a specific level desired by the user by using a first network system, a problem exists in that, when a call is performed by using a second network system, a call sound source changes. Thus, the call sound volume has to be re-determined.

Therefore, a need exists for an apparatus and method for providing an appropriate call sound volume when a call connection system and a call sound source change in a mobile communication terminal.

SUMMARY OF THE INVENTION

An aspect of the present invention is to address at least the above-mentioned problems and/or disadvantages and to provide at least the advantages described below. Accordingly, an aspect of the present invention is to provide a method and apparatus for managing a sound volume of a wireless connection device in a mobile communication terminal supporting a dual Subscriber Identity Module (SIM) card.

Another aspect of the present invention is to provide a method and apparatus for controlling an output sound volume of a sound output device wirelessly connected to a system to which a call is connected by pre-storing sound volume information of each system in a mobile communication terminal supporting a dual SIM card.

In accordance with an aspect of the present invention, a method for managing a sound volume of a wireless connection device in a mobile communication terminal is provided. The method includes pre-storing a sound volume level of the wireless connection device with respect to each system supported by the mobile communication terminal, and when a call is generated, requesting to determine a sound volume by transmitting to the wireless connection device a sound volume level of a system in which the call is generated among the sound volume levels pre-stored for the respective systems.

In accordance with another aspect of the present invention, a method for managing a sound volume of a device wirelessly connected to a mobile communication terminal is provided. The method includes receiving a sound volume level from the mobile communication terminal, and determining a sound volume level of a sound signal to be output from the device according to the received sound volume level.

In accordance with still another aspect of the present invention, a mobile communication terminal for managing a sound volume of a wireless connection device is provided. The mobile communication terminal includes a plurality of communication units for processing transmission/reception signals respectively for a plurality of systems supported by the mobile communication terminal, a storage unit for pre-storing sound volume levels of the wireless connection device for each of the plurality of systems, and a controller requesting to determine a sound volume by transmitting to the wireless connection device a sound volume level of a system in which the call is generated among the sound volume levels pre-stored for the respective systems.

In accordance with another aspect of the present invention, a device wirelessly connected to a mobile communication terminal is provided. The device includes a communication unit for receiving a sound volume level from the mobile communication terminal, a controller for determining a sound volume level of a sound signal to be output from the device according to the received sound volume level, and an output unit for outputting the sound signal received from the mobile communication terminal according to the determined sound volume level.

Other aspects, advantages, and salient features of the invention will become apparent to those skilled in the art from the following detailed description, which, taken in conjunction with the annexed drawing, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention provide a method and apparatus for controlling an output sound volume of a sound output device wirelessly connected to a system to which a call is connected by pre-storing sound volume information of each system in a mobile communication terminal supporting a dual Subscriber Identity Module (SIM) card. Although it will be described hereinafter that the mobile communication terminal and the sound output device are connected using Bluetooth for example, it should be understood that the present invention is not limited thereto. That is, the mobile communication terminal and the sound output device may be connected using a near field communication technique. The sound output device may be a device for receiving a sound signal from the mobile communication terminal and outputting the sound signal. The sound output device may also be a headset or a hand-free device. The headset will be taken as an example in the following description FIG. 1 is a block diagram illustrating a structure of a mobile communication terminal supporting a dual SIM card according to an exemplary embodiment of the present invention.

Figure 1:
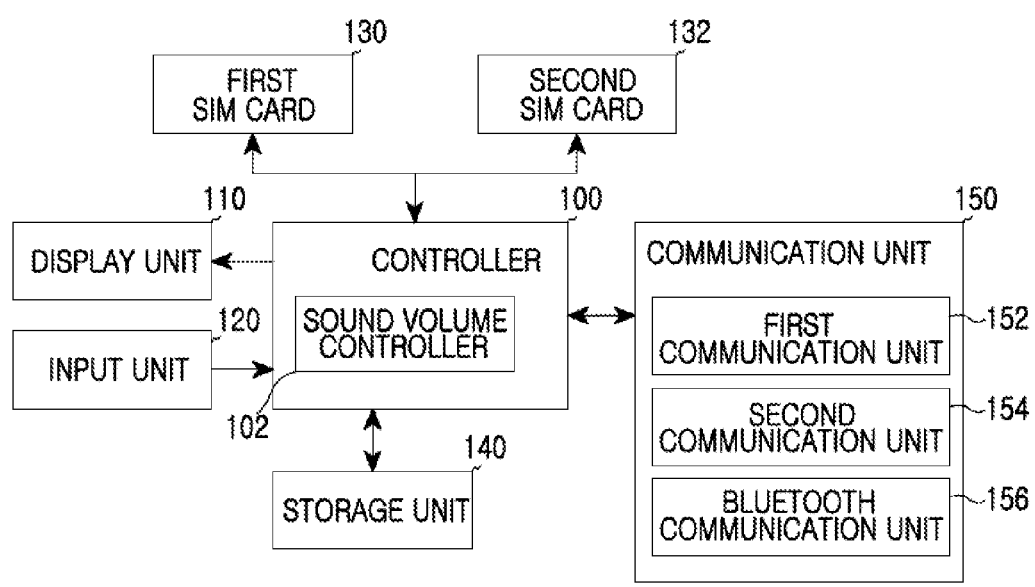
FIG. 1 is a block diagram illustrating a structure of a mobile communication terminal supporting a dual Subscriber Identity Module (SIM) card according to an exemplary embodiment of the present invention.

Referring to FIG. 1, the mobile communication terminal includes a controller 100, a display unit 110, an input unit 120, a first SIM card 130, a second SIM card 132, a storage unit 140, and a communication unit 150. The controller 100 includes a sound volume controller 102. The communication unit 150 includes a first communication unit 152, a second communication unit 154, and a Bluetooth communication unit 156.

The controller 100 controls and processes an overall operation (i.e., voice call and data communication) of the mobile communication terminal. Further, according to an exemplary embodiment of the present invention, the controller 100 includes the sound volume controller 102 to control and process a function for controlling an output sound volume of a headset connected using a Bluetooth communication technique based on a call connection system.

That is, when the headset is first connected using the Bluetooth communication technique or when an event for determining a headset sound volume occurs, the sound volume controller 102 controls a function for determining and storing an output sound volume of the headset for each system. In this case, the sound volume controller 102 processes a pre-stored sound source according to separate mechanisms of the first communication unit 152 supporting a first system and the second communication unit 154 supporting a second system, and then transmits the sound resources to the headset. Further, the sound volume controller 102 controls the display unit 110 to display a message for requesting to determine a sound volume for a corresponding system, to thereby determine the output sound volume of the headset. In this case, the pre-stored sound source according to a mechanism of each system is processed to provide the same effect as when the sound source is received through a corresponding system. The sound volume controller 102 processes the pre-stored sound source according to a mechanism of the first system and then transmits the sound source to the headset. Thereafter, when a specific key is input to announce that the determining of the sound volume is complete, the sound volume controller 102 requests the headset to transmit sound volume information currently determined in the headset, receives the currently determined sound volume information, and stores the received information as sound volume information of the first system. Thereafter, the sound volume controller 102 performs the same operation on the second system, and stores sound volume information of the second system. In this case, the sound volume controller 102 may also store the sound volume information determined using the input unit 120.

When an incoming or outgoing call is generated, the sound volume controller 102 performs a process of connecting to the headset by using the Bluetooth communication technique. In this case, the sound volume controller 102 transmits sound volume information pre-stored for a system in which the call is generated to the headset to allow the headset to determine a sound volume by using the sound volume information. Although the sound volume information may be transmitted any time while the connection process is performed, in terms of efficiency, the sound volume information is transmitted before a sound channel is connected. Further, when the sound volume is controlled during the call connection, the sound volume controller 102 controls a function for updating sound volume information of each system by storing information on the controlled sound volume.

The display unit 110 displays status information, alphanumeric characters, still images, moving images generated during the operation of the portable terminal, and the like. Further, under the control of the sound volume controller 102, the display unit 110 displays a message for requesting a user to determine a sound volume as illustrated in FIG. 5.

The input unit 120 includes a plurality of alphanumeric keys and function keys to provide the controller 100 with functions mapped to the keys to be selected by the user. Upon receiving a key input for reporting that the determining of the sound volume is complete, the input unit 120 provides a corresponding function to the sound volume controller 102. Upon receiving a key input for controlling the sound volume, the input unit 120 provides a corresponding function to the sound volume controller 102.

The first SIM card 130 and the second SIM card 132 are attachable to and detachable from the mobile communication terminal, and include microprocessors and memory chips to store a variety of user information. In this case, the first SIM card 130 and the second SIM card 132 support different network systems.

The storage unit 140 stores a variety of programs and data for an overall operation of the mobile communication terminal. More particularly, the storage unit 140 stores sound volume information of each system supported by the mobile communication terminal under the control of the sound volume controller 102. In this case, the storage unit 140 stores a per-system sound volume information in a non-volatile memory so that the per-system sound volume information is maintained irrespective of a power on/off state of the mobile communication terminal.

The communication unit 150 transmits and receives a signal with respect to base stations of the first system and the second system under the control of the controller 100. The communication unit 150 also transmits and receives a signal with respect to a headset by using the Bluetooth communication technique. That is, the communication unit 150 includes the first communication unit 152 for transmitting and receiving a signal with respect to the first network system, the second communication unit 154 for transmitting and receiving a signal with respect to the second network system, and the Bluetooth communication unit 156 for transmitting and receiving a signal by using the Bluetooth communication technique.

For example, when the first communication unit 152 and the second communication unit 154 support a Universal Mobile Telecommunication System (UMTS) system and a Global System for Mobile Communications (GSM) system, respectively, the first communication unit 152 operates when a UMTS mode is selected under the control of the controller 100. The first communication unit 152 performs a function for de-spreading and channel decoding by decreasing a frequency of a signal received through an antenna, performs a function for channel coding and spreading on to-be-transmitted data, and then performs a function for increasing the frequency of the signal and transmitting the signal through the antenna.

The second communication unit 154 operates when a GSM mode is selected under the control of the controller 100. The second communication unit 154 performs a function for converting a frequency of a radio signal received through an antenna to a center frequency. Thereafter, the second communication unit 154 performs a function for demodulating a baseband signal from the center frequency and for modulating to-be-transmitted data to the center frequency. The second communication unit 154 converts the center frequency to a radio signal and transmits the signal through the antenna.

The Bluetooth communication unit 156 scans peripheral devices that may be connected using the Bluetooth communication technique under the control of the controller 100, and registers the devices by performing paring on the scanned peripheral devices. When communication is performed with a registered peripheral device, the Bluetooth communication unit 156 decreases a frequency of a radio signal received from the peripheral device to convert the signal to a baseband signal, and provides the baseband signal to the controller 100. The Bluetooth communication unit 156 converts to-be-transmitted data to an analog signal, converts the signal into a radio signal by increasing a frequency of the signal, and transmits the signal to the peripheral device. More particularly, the Bluetooth communication unit 156 transmits sound volume information to the peripheral device (i.e., a sound output device) under the control of the sound volume controller 102.

Figure 2:
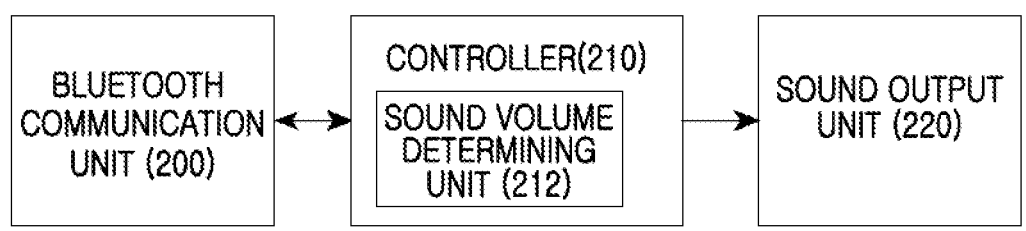
FIG. 2 is a block diagram illustrating a structure of a sound output device according to an exemplary embodiment of the present invention.

FIG. 2 is a block diagram illustrating a structure of a sound output device according to an exemplary embodiment of the present invention.

Referring to FIG. 2, the sound output device includes a Bluetooth communication unit 200, a controller 210, and a sound output unit 220.

When communication with a peripheral device is performed under the control of the controller 210, the Bluetooth communication unit 200 converts a radio signal received from the peripheral device into a baseband signal by decreasing a frequency of the radio signal and thereafter provides the baseband signal to the controller 210. The Bluetooth communication unit 200 converts to-be-transmitted data into an analog signal, converts the analog signal into a radio signal by increasing a frequency of the signal, and transmits the signal to the peripheral device. More particularly, the Bluetooth communication unit 200 provides the controller 210 with sound volume information received from the peripheral device, i.e., a mobile communication terminal.

The controller 210 controls and processes an overall operation of the sound output device, a function for connecting to the mobile communication terminal by using the Bluetooth communication unit 200, and a function for determining an output sound volume of the sound output unit 220 according to the sound volume information received from the mobile communication terminal via a sound volume determining unit 212 included in the controller 210. The sound volume determining unit 212 includes a sound volume determining key (not illustrated) to control and process a function for controlling an output sound volume of the sound output unit 220 according to the input sound volume determining key when the sound volume determining key is input by a user.

When the determining of the sound volume is complete, the sound volume determining unit 212 controls and processes a function for transmitting information regarding the determined sound volume to the connected mobile communication terminal.

The sound output unit 220 converts data provided from the controller 210 into an analog sound signal, and outputs the converted sound signal with the sound volume determined by the sound volume determining unit 212 included in the controller 210.

Figure 3A:
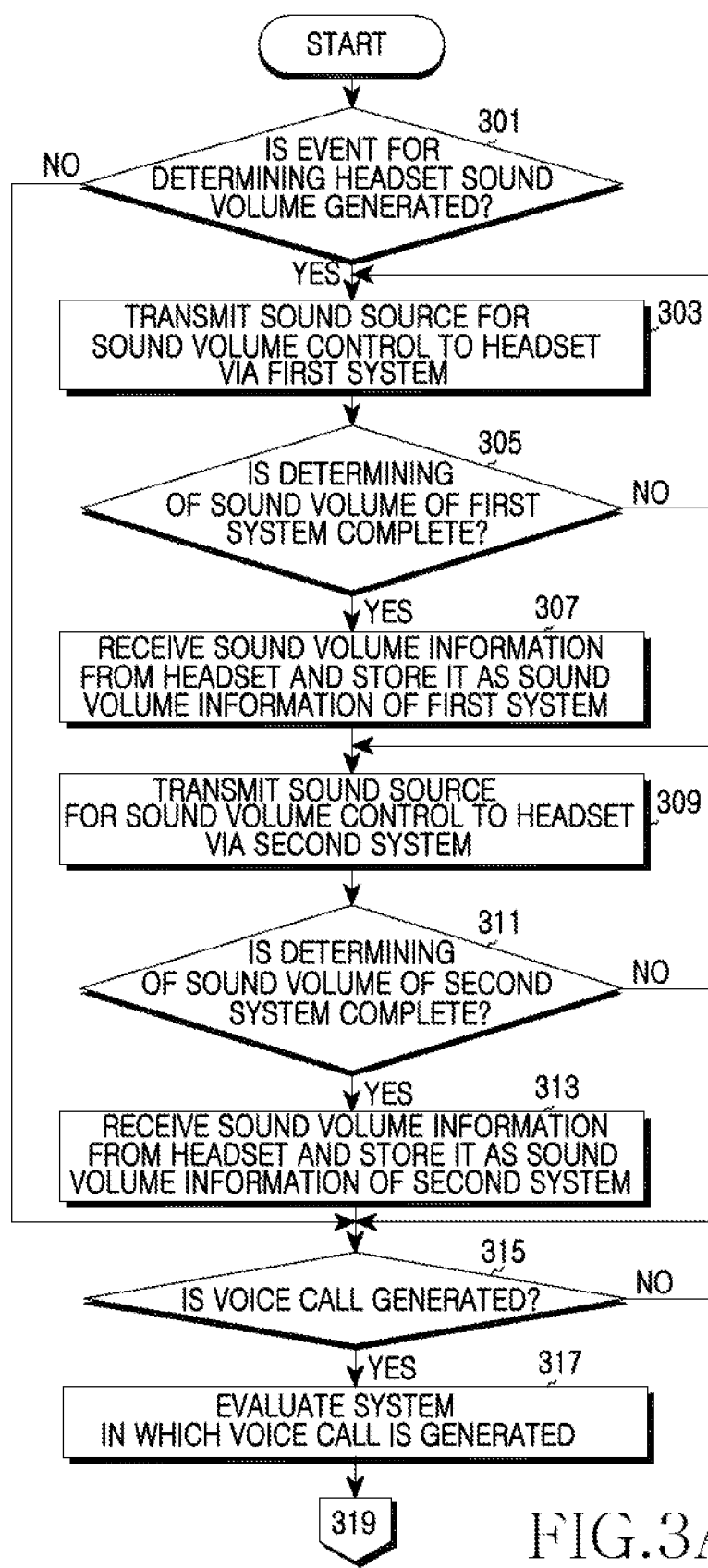
FIGS. 3A and 3B are flowcharts illustrating a process of controlling an output sound volume of a sound output device wirelessly connected to a mobile communication terminal supporting a dual SIM card according to an exemplary embodiment of the present invention.
Figure 3B:
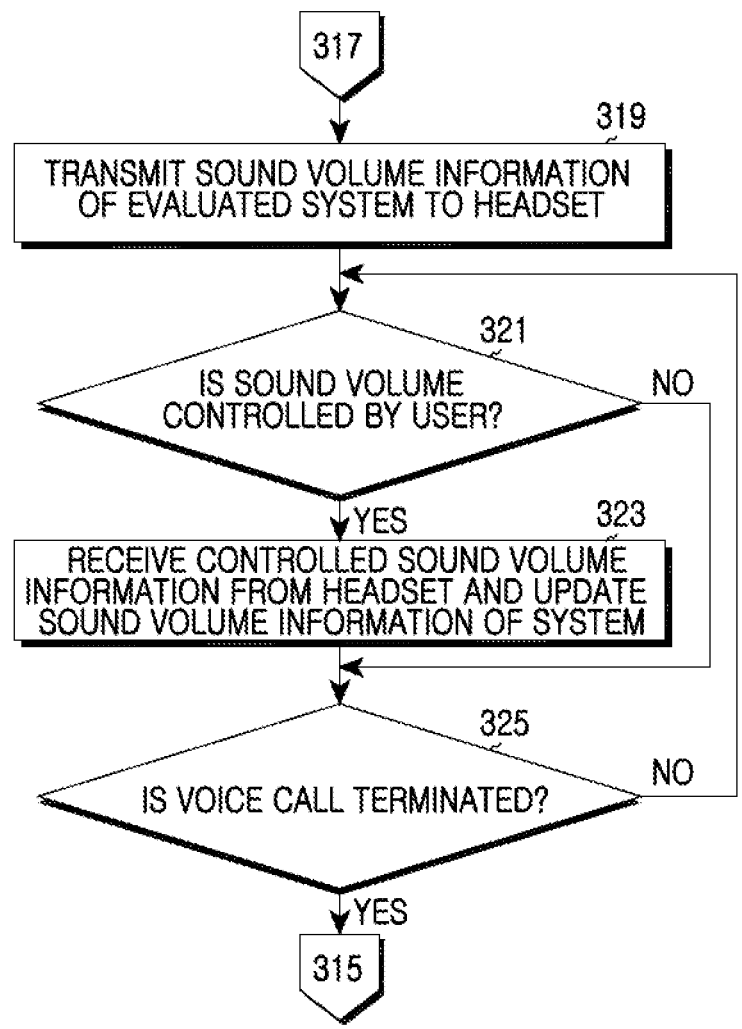

FIGS. 3A and 3B are flowcharts illustrating a process of controlling an output sound volume of a sound output device wirelessly connected to a mobile communication terminal supporting a dual SIM card according to an exemplary embodiment of the present invention.

Referring to FIGS. 3A and 3B, the mobile communication terminal evaluates whether an event for determining a sound volume of a headset is generated in step 301. That is, the mobile communication terminal evaluates whether it is first connected to the headset by using a Bluetooth communication technique or a program for determining the sound volume of the headset is executed by key manipulation of a user. If the event for determining the sound volume of the headset is not generated, the procedure proceeds to step 315.

Figure 5A:
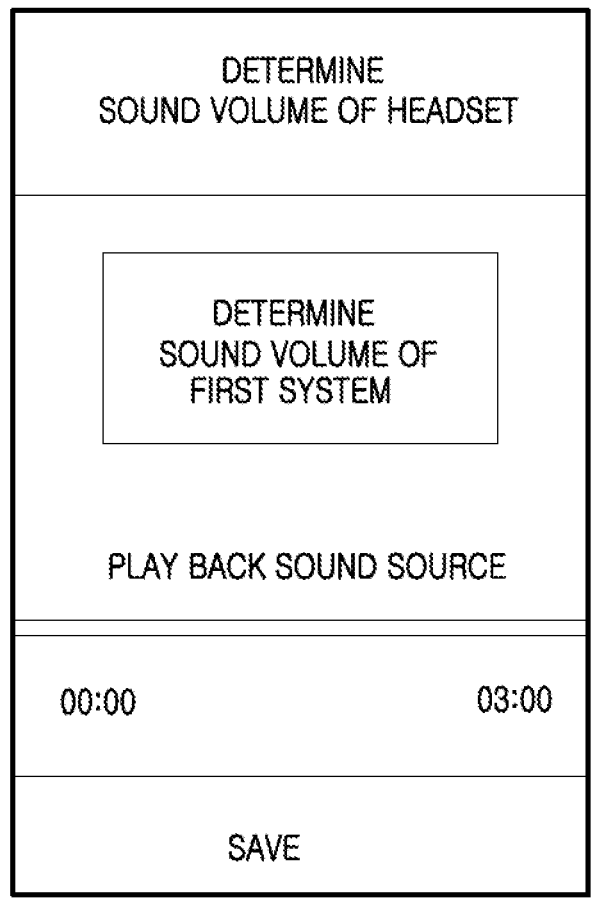
FIG. 5A and FIG. 5B illustrate a screen configured for determining and storing sound volume information of each system in a mobile communication terminal supporting a dual SIM card according to an exemplary embodiment of the present invention.

When the event for determining the sound volume of the headset is generated, the mobile communication terminal evaluates a pre-stored sound source to control a sound volume, processes the sound source according to a mechanism of a first system, and transmits the sound source to the headset connected using the Bluetooth communication technique in step 303. In this case, as illustrated in FIG. 5A, the mobile communication terminal transmits the pre-stored sound source to the headset. Thereafter, the mobile communication terminal displays the sound source to a screen to allow the user to be able to determine a sound volume of the first system.

In step 305, the mobile communication terminal evaluates whether the determining of the sound volume of the first system is complete by key manipulation of the user. In this case, the sound volume may be, or may not be, controlled by manipulating a sound volume key of the mobile communication terminal or the headset. If the determining of the sound volume of the first system is not complete, the mobile communication terminal continues to transmit the sound source in step 303. Otherwise, if the determining of the sound volume of the first system is complete, the mobile communication terminal receives sound volume information from the headset and stores the sound volume information as sound volume information of the first system in step 307. Herein, when the sound volume key of the terminal is controlled, the mobile communication terminal may store a sound volume level determined in the terminal together with sound volume information received from the headset.

Figure 5B:
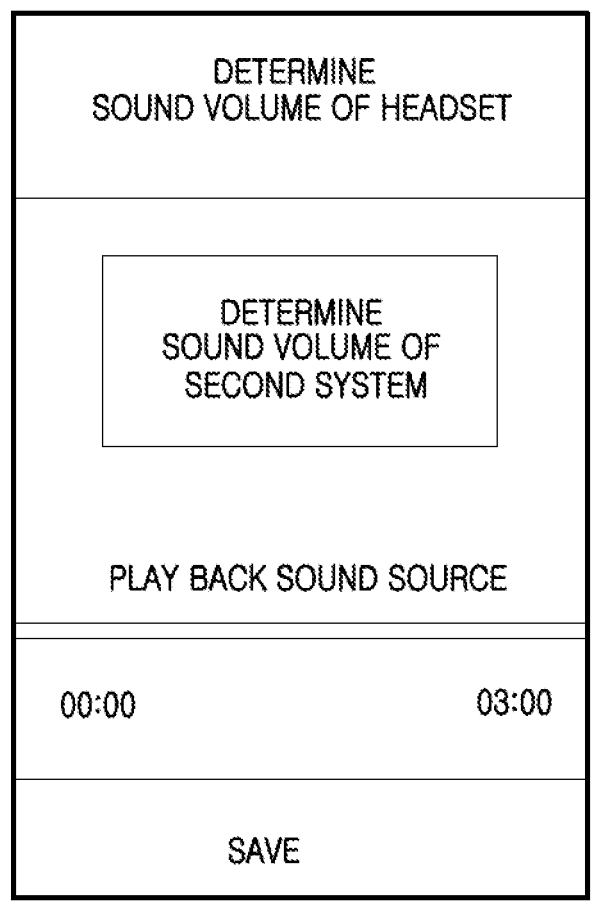

In step 309, to determine a sound volume of a second system, the mobile communication terminal processes the pre-stored sound volume according to a mechanism of the second system and transmits the sound volume to the headset. In this case, as illustrated in FIG. 5B, the mobile communication terminal transmits the pre-stored sound source to the headset. Thereafter, the mobile communication terminal displays the sound source to a screen to allow the user to be able to determine the sound volume of the second system.

In step 311, the mobile communication terminal evaluates whether the determining of the sound volume of the second system is complete by key manipulation of the user. In this case, the sound volume may be controlled by manipulating a sound volume key of the mobile communication terminal or the headset. If the determining of the sound volume of the second system is not complete, the mobile communication terminal continues to transmit the sound source in step 309. Otherwise, if the determining of the sound volume of the second system is complete, the mobile communication terminal receives sound volume information from the headset connected using the Bluetooth mechanism and stores the information as sound volume information of the second system in step 313. Herein, when the sound volume key of the terminal is controlled, the mobile communication terminal may store a sound volume level determined in the terminal together with sound volume information received from the headset. In this case, the mobile communication terminal may terminate or maintain a Bluetooth connection with the headset by key manipulation of the user.

Figure 6A:
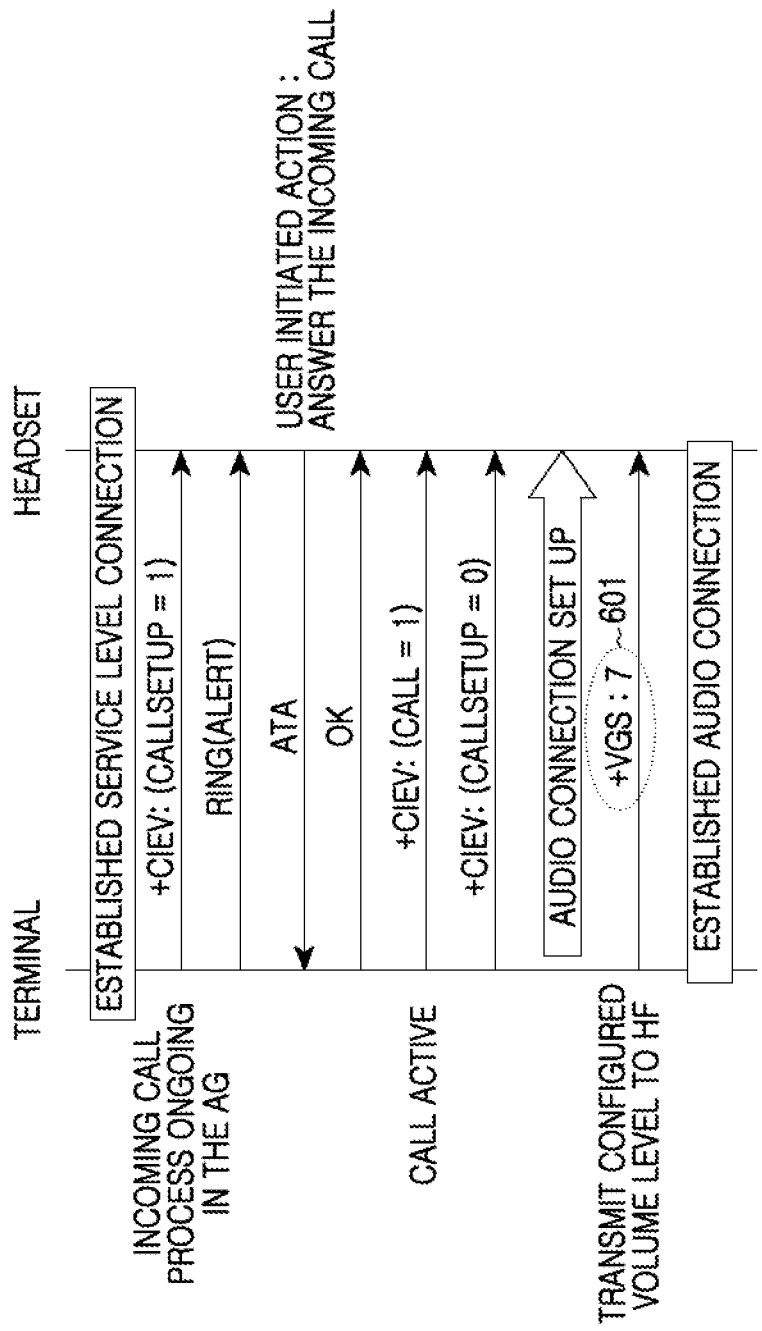
FIG. 6A and FIG. 6B illustrate a signal flow of an operation for determining a sound volume between a sound output device and a mobile communication supporting a dual SIM card according to an exemplary embodiment of the present invention.
Figure 6B:
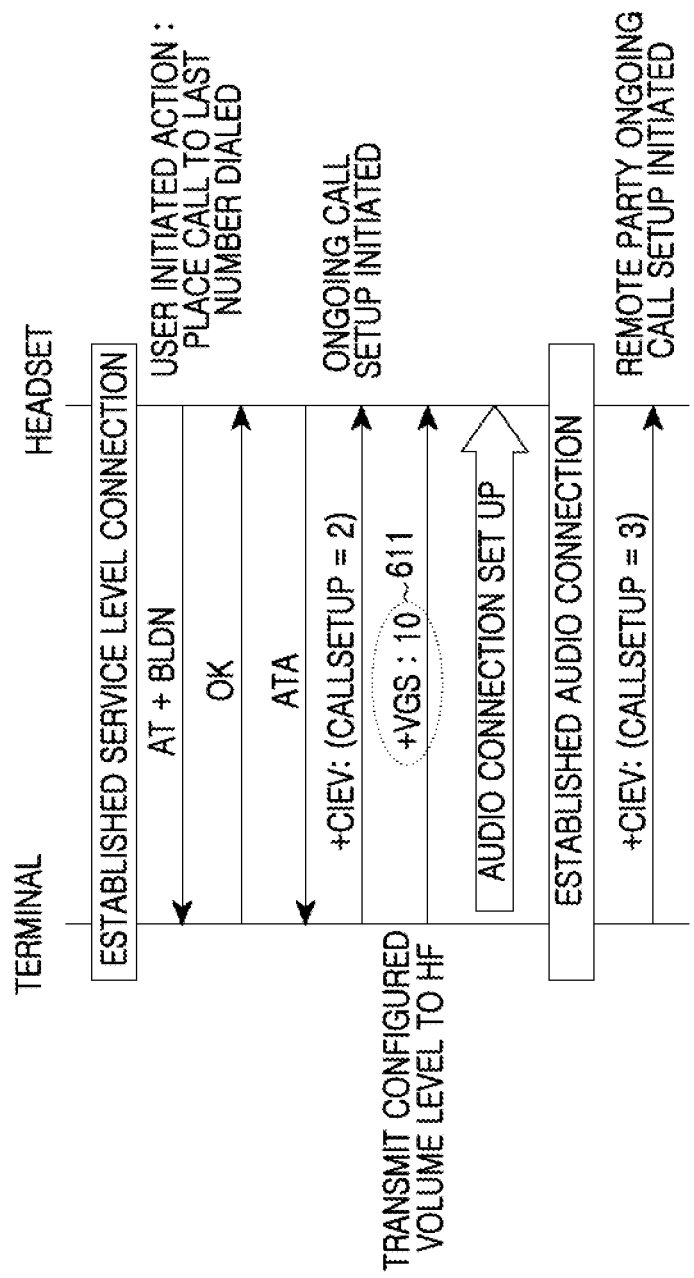

In step 315, the mobile communication terminal evaluates whether a voice call is generated. If the voice call is generated, the mobile communication terminal evaluates a system in which the voice call is generated in step 317. Thereafter, the mobile communication terminal transmits sound volume information of the evaluated system to the headset connected using Bluetooth in step 319. For example, when the voice call is generated via the first system, the mobile communication terminal transmits sound volume information of the first system to the headset among pre-stored sound volume information of each system. In this case, if the mobile communication terminal is previously connected to the headset using Bluetooth, the mobile communication terminal transmits only the sound volume information to allow the headset to determine a sound output level according to the sound volume information. Otherwise, if the mobile communication terminal is not connected to the headset using Bluetooth, the mobile communication terminal processes to connect to the headset by using Bluetooth, and transmits the sound volume information to the headset while performing the connection process to determine a sound output level. In this case, the sound volume information may be transmitted any time while the Bluetooth connection process is performed. For example, as illustrated in FIG. 6A, in a case of an incoming call, information indicating that a sound volume level to be determined by the headset is 7. The information may be transmitted after a call is connected (indicated by 601 in FIG. 6A). Also, as illustrated in FIG. 6B, in a case of an outgoing call, the headset may transmit information indicating that the sound volume to be determined by the headset is 10. The information may be transmitted before a call is connected (indicated by 611 in FIG. 6B).

In step 321, the mobile communication terminal evaluates whether a sound volume is controlled by the user. When the sound volume is controlled, the mobile communication terminal receives controlled sound volume information from the headset and updates sound volume information of the system in which the voice call is generated in step 323.

Otherwise, if the sound volume is not controlled, the mobile communication terminal evaluates whether the voice call is terminated in step 325. If the voice call is not terminated, the procedure returns to step 321 and repeats the subsequent steps. Otherwise, if the voice call is terminated, the procedure returns to step 315 and repeats the subsequent steps.

Figure 4:
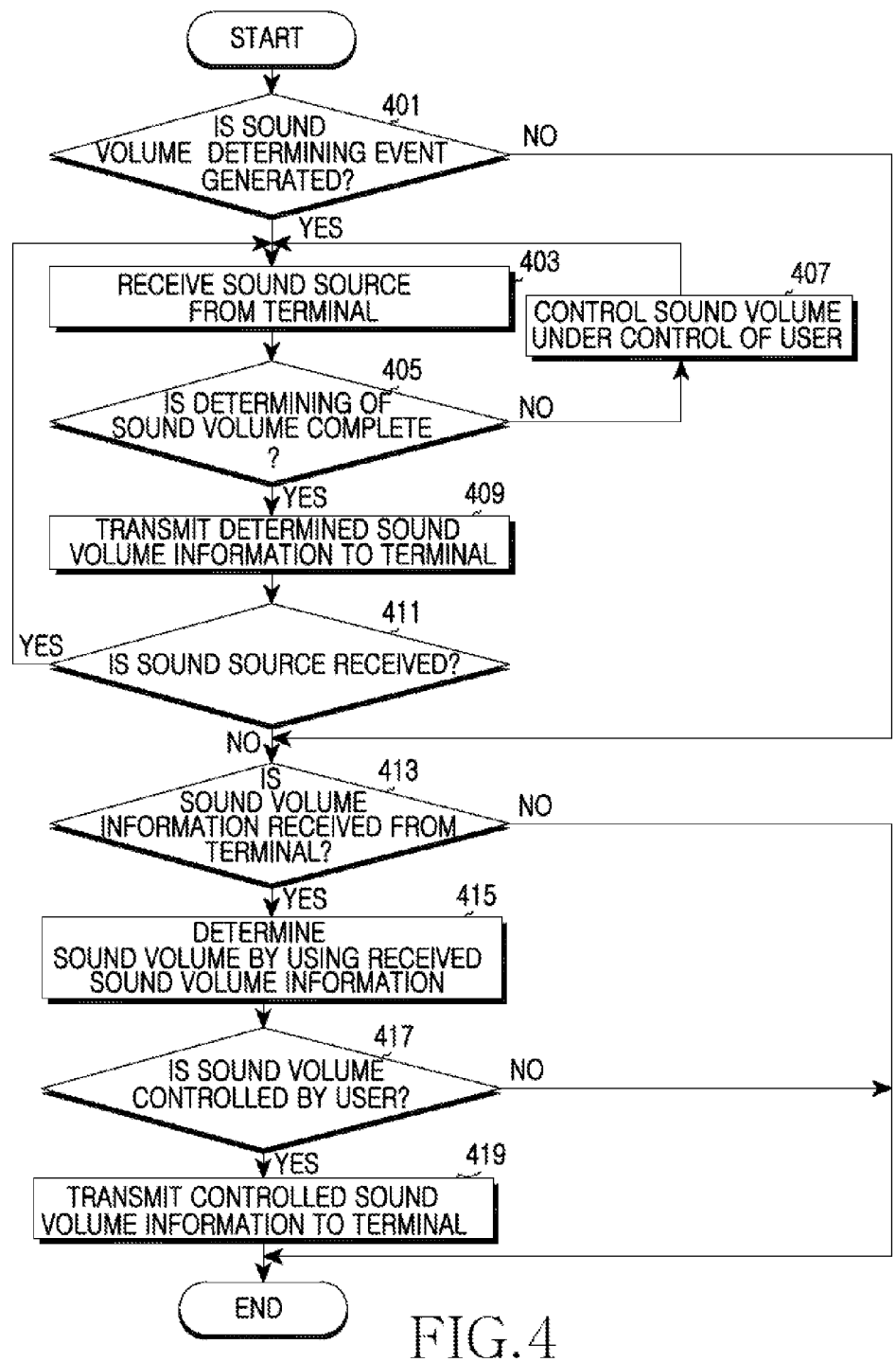
FIG. 4 is a flowchart illustrating a process of controlling an output sound volume under control of a mobile communication terminal wirelessly connected to a sound output device according to an exemplary embodiment of the present invention.

FIG. 4 is a flowchart illustrating a process of controlling an output sound volume under control of a mobile communication terminal wirelessly connected to a sound output device according to an exemplary embodiment of the present invention.

Referring to FIG. 4, the sound output device evaluates whether an event for determining an output sound volume is generated in step 401. That is, the sound output device evaluates whether it is first connected to the mobile communication terminal by using a Bluetooth communication technique or whether a request for determining a sound volume is received from the mobile communication terminal connected using Bluetooth. When the event for determining the sound volume is not generated, the procedure proceeds to step 413. Otherwise, if the event for determining the sound volume is generated, the sound output device receives a sound source from the mobile communication terminal connected using Bluetooth and plays back the sound source in step 403. In step 405, the sound output device evaluates whether the determining of the sound volume is complete. If the determining of the sound volume is not complete, the sound output device controls the sound volume under the control of a user in step 407, and the procedure returns to step 403.

When the determining of the sound volume is complete, the sound output device transmits currently determined sound volume information to the mobile communication terminal in step 409. In this case, after the determining of the sound volume is complete, the sound output device may release or maintain a Bluetooth connection with the mobile communication terminal under the control of the user or the mobile communication terminal.

In step 411, the sound output device evaluates whether the sound source is received from the mobile communication terminal. If the sound source is received from the mobile communication terminal, the procedure returns to step 403 and repeats the subsequent steps.

Otherwise, if the sound source is not received from the mobile communication terminal, the sound output device evaluates whether the sound volume information is received in step 413. If the sound volume information is not received from the mobile communication terminal, the procedure ends. Otherwise, if the sound volume information is received from the mobile communication terminal, the sound output device determines a sound output level, i.e., a sound volume, by using the received sound volume information in step 415. In this case, if the sound output device is not connected using Bluetooth to the mobile communication terminal, the sound output device connects a service level and a sound channel to the mobile communication terminal by performing a Bluetooth connection process, and receives the sound volume information from the mobile communication terminal while performing the connection process.

In step 417, the sound output device evaluates whether a sound volume is controlled by the user. If the sound volume is controlled, the sound output device transmits the controlled sound volume information to the mobile communication terminal in step 419. Otherwise, if the sound volume control is not controlled, the procedure ends.

Although a method for managing a sound volume of a wireless connection device in a mobile communication terminal supporting two systems by employing a dual SIM card has been described above, it should be understood that the present invention is not limited thereto. That is, the exemplary embodiments of the present invention may be implemented with a mobile communication terminal supporting a plurality of systems.

According to exemplary embodiments of the present invention, a mobile communication terminal supporting a dual SIM card pre-stores sound volume information of each system to control an output sound volume of a sound output device wirelessly connected to a system to which a call is connected. Therefore, if a call connection system changes, a call can be performed with an appropriate preset sound volume without a user's operation for controlling the sound volume.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method in a mobile communication terminal for supporting a plurality of communication systems, the method comprising:
    storing a plurality of sound volume levels, wherein a sound volume level is stored by:
    selecting a communication system, among a plurality of communication systems, supported by the mobile communication terminal;
    selecting a wireless connection device among a plurality of wireless connection devices that can be connected to the mobile communication terminal via near field communication techniques;
    receiving a sound volume level for the selected communication system and the selected wireless connection device; and
    storing the received sound volume level;
    upon detecting a call connection,
    identifying a first communication system in which the call connection is detected;
    connecting the mobile communication terminal to a wireless connection device through a second communication system;
    selecting a first sound volume level corresponding to the identified first communication system and the connected wireless connection device among the plurality of sound volume levels;
    transmitting a sound signal to the connected wireless connection device based on the first sound volume level through the second communication system;
    if a sound volume is changed during the call connection, updating the first sound volume level based on the changed sound volume.

2. The method of claim 1, wherein the near field communication techniques include a Bluetooth communication.

3. The method of claim 1, wherein the mobile communication terminal supports the plurality of communication systems using Subscriber Identity Module cards.

4. A mobile communication terminal comprising:
    at least one communication unit configured to process transmission/reception of a signal in the mobile communication terminal supporting a plurality of communication systems;
    a storage unit configured to store a sound volume level with respect to each of the plurality of communication systems; and
    a controller configured to select a communication system, among a plurality of communication systems, supported by the mobile communication terminal, select a wireless connection device among a plurality of wireless connection devices that can be connected to the mobile communication terminal via near field communication techniques, to receive a sound volume level for the selected communication system and the selected wireless connection device, to store the received sound volume level in the storage unit, upon detecting a call connection, to identify a first communication system in which the call connection is detected, to connect the mobile communication terminal to a wireless connection device through a second communication system, to select a first sound volume level corresponding to the identified first communication system and the connected wireless connection device among the stored sound volume levels in the storage unit, to transmit a sound signal to the connected wireless connection device based on the first sound volume level, and if a sound volume is changed during the call connection, to update the first sound volume level based on the changed sound volume.

5. The mobile communication terminal of claim 4, wherein the near field communication techniques include a Bluetooth communication.

6. The mobile communication terminal of claim 4, wherein the mobile communication terminal supports the plurality of communication systems using Subscriber Identity Module cards.

* * * * *